(12) United States Patent
Yao

(10) Patent No.: US 12,733,218 B2
(45) Date of Patent: Sep. 8, 2026

(54) SEMICONDUCTOR DEVICE WITH A FIRST PARALLEL PN STRUCTURE IN THE ACTIVE REGION AND A SECOND PARALLEL PN STRUCTURE IN THE TERMINATION REGION WHEREIN THE DEPTH OF THE SECOND PARALLEL STRUCTURE BECOMES STEPWISE SHALLOWER TOWARDS THE PERIPHERY

(71) Applicant: FUJI ELECTRIC CO., LTD., Kawasaki (JP)

(72) Inventor: Noriaki Yao, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 556 days.

(21) Appl. No.: 18/160,162

(22) Filed: Jan. 26, 2023

(65) Prior Publication Data

US 2023/0299131 A1 Sep. 21, 2023

(30) Foreign Application Priority Data

Mar. 16, 2022 (JP) ................................ 2022-040859

(51) Int. Cl.
*H10D 62/10* (2025.01)
*H10D 30/01* (2025.01)
(Continued)

(52) U.S. Cl.
CPC ....... *H10D 62/111* (2025.01); *H10D 30/0291* (2025.01); *H10D 62/393* (2025.01); *H10P 30/22* (2026.01)

(58) Field of Classification Search
CPC ............ H10D 62/111; H10D 30/0291; H10D 62/393; H10D 30/668; H10D 30/665;
(Continued)

(56) References Cited

U.S. PATENT DOCUMENTS

2003/0207536 A1* 11/2003 Miyasaka ............ H10D 62/111
257/E21.418
2007/0272979 A1* 11/2007 Saito ...................... H10D 8/411
257/E29.328
(Continued)

FOREIGN PATENT DOCUMENTS

JP 2004022716 A * 1/2004 ........... H10D 62/051
JP 2007-335844 A 12/2007
(Continued)

OTHER PUBLICATIONS

Translation of Sato (JP 2004-022716 A) (Year: 2004).*
(Continued)

*Primary Examiner* — William B Partridge
*Assistant Examiner* — Ilker Ozden
(74) *Attorney, Agent, or Firm* — Rabin & Berdo, P.C.

(57) ABSTRACT

A superjunction semiconductor device has: a semiconductor substrate of a first conductivity type; a buffer layer of the first conductivity type, provided on a front surface of the semiconductor substrate and having an impurity concentration lower than that of the semiconductor substrate; a drift layer of the first conductivity type, provided on the buffer layer and having an impurity concentration lower than that of the buffer layer; and a parallel pn structure having first column regions of the first conductivity type and second column regions of a second conductivity type repeatedly alternating one another in a direction parallel to the front surface. A subset of the first and second column regions are located in a termination structure portion and have depths that become shallower stepwise towards an end of the semiconductor substrate, where the second column regions are provided with bottoms thereof in the drift layer.

8 Claims, 12 Drawing Sheets

(51) Int. Cl.
*H10D 62/17* (2025.01)
*H10P 30/22* (2026.01)

(58) Field of Classification Search
CPC .. H10D 62/112; H10D 62/127; H10D 62/105; H10D 62/106; H10D 30/63; H10D 62/124; H01L 21/266
See application file for complete search history.

(56) References Cited

U.S. PATENT DOCUMENTS

| | | | | |
|---|---|---|---|---|
| 2008/0315299 | A1 * | 12/2008 | Saito .................... | H10D 62/111 257/329 |
| 2014/0197477 | A1 * | 7/2014 | Onishi ................. | H10D 30/665 257/329 |
| 2015/0364577 | A1 | 12/2015 | Nishimura et al. | |
| 2015/0380542 | A1 * | 12/2015 | Weyers .................. | H10D 30/65 257/329 |
| 2017/0200784 | A1 * | 7/2017 | Shirakawa ........... | H10D 62/111 |
| 2021/0167167 | A1 * | 6/2021 | Kawada ............... | H10D 62/111 |

FOREIGN PATENT DOCUMENTS

| | | | |
|---|---|---|---|
| JP | 2014138077 | A | 7/2014 |
| JP | 2016-021547 | A | 2/2016 |
| JP | 2017126600 | A | 7/2017 |

OTHER PUBLICATIONS

Translation of JP 200422716 A (Sato) (Year: 2004).*
Office Action issued for corresponding Japanese Patent Application No. 2022-040859 dated Dec. 2, 2025.

* cited by examiner

SEMICONDUCTOR DEVICE WITH A FIRST PARALLEL PN STRUCTURE IN THE ACTIVE REGION AND A SECOND PARALLEL PN STRUCTURE IN THE TERMINATION REGION WHEREIN THE DEPTH OF THE SECOND PARALLEL STRUCTURE BECOMES STEPWISE SHALLOWER TOWARDS THE PERIPHERY

CROSS REFERENCE TO RELATED APPLICATIONS

This application is based upon and claims the benefit of priority of the prior Japanese Patent Application No. 2022-040859, filed on Mar. 16, 2022, the entire contents of which are incorporated herein by reference.

BACKGROUND OF THE INVENTION

1. Field of the Invention

Embodiments of the invention relate to a superjunction semiconductor device.

2. Description of the Related Art

In a normal n-type channel vertical metal oxide semiconductor field effect transistor (MOSFET), among multiple semiconductor layers formed in a semiconductor substrate, an n-type conductive layer (drift layer) is the semiconductor layer with the highest resistance. Electrical resistance of the n-type drift layer greatly affects the ON resistance of the entire vertical MOSFET. By reducing the thickness of the n-type drift layer and thereby, shortening the current path, reduction of the ON resistance of the entire vertical MOSFET may be realized.

Nonetheless, in the vertical MOSFET, during the OFF, a depletion layer spreads to the n-type drift layer, which has a high resistance state and, thus, further has a function of maintaining the breakdown voltage. Therefore, in an instance in which the thickness of the n-type drift layer is decreased to reduce the ON resistance, spreading of the depletion layer during the OFF state is shortened and thus, the critical electric field strength is likely to be reached by application of a low voltage, whereby the breakdown voltage decreases. On the other hand, it is necessary to increase the thickness of the n-type drift layer to increase the breakdown voltage of the vertical MOSFET, whereby the ON resistance increases. A relationship like this between the ON resistance and the breakdown voltage is called a tradeoff relationship and it is generally difficult to enhance both members that are in a tradeoff relationship. The tradeoff relationship between the ON resistance and the breakdown voltage is known to similarly exist in semiconductor devices such as insulated gate bipolar transistors (IGBTs), bipolar transistors, diodes, etc.

As for a structure of a semiconductor device that solves the problems described above, a superjunction (SJ) structure is known. For example, a MOSFET that has a superjunction structure (hereinafter, SJ-MOSFET) is known. FIG. 21 is a schematic plan diagram depicting a structure of a SJ-MOSFET of a first conventional structure. FIG. 22 is a schematic cross-sectional diagram of the structure of the SJ-MOSFET of the first conventional structure along cutting line A-A' in FIG. 21. FIG. 21 depicts an arrangement of n-type column regions 103 and p-type column regions 104 of the first conventional structure in a plan view. FIG. 22 depicts a cross-sectional view of the structure of the n-type column regions 103 and the p-type column regions 104 of the first conventional structure.

As depicted in FIG. 22, in the SJ-MOSFET of the first conventional structure, for example, an n-type buffer layer 102 is epitaxially grown on an $n^{++}$-type semiconductor substrate 101 that contains, for example, silicon (Si) and has a high impurity concentration; and an n-type drift layer 106 is epitaxially grown on the n-type buffer layer 102. The p-type column regions 104 are provided in a direction from a surface 200 of the n-type drift layer 106 to the $n^{++}$-type semiconductor substrate 101. The n-type buffer layer 102 is provided between the $n^{++}$-type semiconductor substrate 101 and bottoms of the p-type column regions 104. In FIG. 22, the n-type buffer layer 102 is provided between the p-type column regions 104 and the $n^{++}$-type semiconductor substrate 101, however, the p-type column regions 104 and the n-type column regions 103 may be in contact with the $n^{++}$-type semiconductor substrate 101.

Further, in the n-type drift layer 106 is a parallel structure (hereinafter, indicated as a parallel pn region 120) in which p-type regions (the p-type column regions 104) and n-type regions (the n-type column regions 103) extending in a direction orthogonal to a substrate main surface and having a narrow width in a plane parallel to the substrate main surface are arranged repeatedly alternating with one another in a plane parallel to the substrate main surface. The n-type column regions 103 configuring the parallel pn region 120 are regions having a higher impurity concentration than that of the n-type buffer layer 102. In the parallel pn region 120, concentrations of impurities contained in the p-type column regions 104 and the n-type column regions 103 are set to be substantially equal, whereby in the OFF state, a pseudo-non-doped layer is created, whereby the breakdown voltage may be increased.

Further, as depicted in FIGS. 21 and 22, the parallel pn region 120 is provided not only an active region 130, which is a region in which a device element structure is formed and through which current flows during an ON state, but also in an edge termination region 140 surrounding a periphery of the active region 130. The edge termination region 140 is a region that mitigates electric field of the surface 200 side of the n-type drift layer 106 and maintains the breakdown voltage. In the edge termination region 140, an edge termination R portion 142, which is a corner portion that has been rounded, is provided to mitigate electric field.

Further, the SJ-MOSFET of the first conventional structure has a MOS gate (insulated gate formed by a metal, an oxide film, and a semiconductor) structure in the surface 200 side of the n-type drift layer 106. While not depicted, the MOS gate structure formed by p-type base regions, $n^{+}$-type source regions, $p^{++}$-type contact regions, a gate insulating film, and gate electrodes is provided on the parallel pn region 120 of the active region 130 through which current flows during the ON state when a device element is formed.

As a front electrodes, a source electrode in contact with the $p^{++}$-type contact regions and the $n^{+}$-type source regions is provided; and as a back electrode, a drain electrode (not depicted) is provided on a back surface (surface opposite to that where the n-type buffer layer 102 is provided) of the $n^{++}$-type semiconductor substrate 101.

In such a SJ-MOSFET, when current is applied between the drain electrode and the source electrode, a depletion layer spreads between the p-type base regions and the n-type drift layer 106 and the breakdown voltage is maintained. The depletion layer spreads in a vertical direction from the source electrode side to the drain electrode side and concurrently, in a horizontal direction and thus, it is necessary to devise a termination structure for controlling the spreading of the depletion layer in the edge termination region 140. Characteristics of the device element are mainly determined by characteristics of the active region 130 and therefore, to maximize performance of the device element, the breakdown voltage of the edge termination region 140 is maintained higher than that of the active region 130.

The magnitude of the breakdown voltage is determined by the width of the depletion layer, which is dependent on the impurity concentration and thus, the lower is the impurity concentration and the wider is the depletion layer, the higher the breakdown voltage may be maintained. When the depletion layer spreading in a horizontal direction reaches the device element, punch-through occurs and the breakdown voltage cannot be maintained and therefore, spreading of the depletion layer has to be stopped in the edge termination region 140. Nonetheless, when the spreading of the depletion layer is stopped abruptly, avalanche current is generated due to the concentration of electric field, whereby the device element may be destroyed and when the spreading is to be stopped gradually, the width of the edge termination region 140 increases, whereby the device element increases in size and therefore, the spreading of the depletion layer has to be suppressed in a balanced manner.

In the SJ-MOSFET, the parallel pn region 120 is also disposed in the edge termination region 140 and therefore, control of the depletion layer of the pn junctions of the edge termination region 140 is important.

Further, a semiconductor device is known in which relative to the process variation of depths of first semiconductor pillar regions and second semiconductor pillar regions adjacent to a high-resistance semiconductor layer, decreases in the breakdown voltage are small due to a superjunction structure portion in which border regions are disposed shallower stepwise so that the closer a border region is to an end portion, the shallower is the border region (for example, refer to Japanese Laid-Open Patent Publication No. 2007-335844).

Further, a semiconductor device is known in which a local insulating film is formed after ion implantation is performed for forming p-type regions of a second parallel pn layer in a first semiconductor layer deposited on a first parallel pn layer, whereby no step at semiconductor portion surface due to the local insulating film is present and even in an instance in which the parallel pn layer is reduced in size, an ion implantation mask may be formed accurately without pattern defects occurring and the breakdown voltage of a termination structure portion may be enhanced (for example, refer to Japanese Laid-Open Patent Publication No. 2016-021547).

SUMMARY OF THE INVENTION

According to an embodiment of the invention, a superjunction semiconductor device having an active region and a termination structure portion disposed on an outer side of the active region so as to surround a periphery of the active region in a plan view of the superjunction semiconductor device, the superjunction semiconductor device includes: a semiconductor substrate of a first conductivity type; a buffer layer of the first conductivity type, provided on a surface of the semiconductor substrate and having an impurity concentration that is lower than an impurity concentration of the semiconductor substrate; a drift layer of the first conductivity type, provided on an upper surface of the buffer layer and having an impurity concentration that is lower than the impurity concentration of the buffer layer; a plurality of first column regions of the first conductivity type and a plurality of second column regions of a second conductivity type, repeatedly alternating one another in a direction parallel to the surface of the semiconductor substrate, the first and second column regions in the active region forming a first parallel pn structure, and the first and second column regions in the termination structure portion forming a second parallel pn structure; a plurality of base regions of the second conductivity type, provided in the first parallel pn structure at a surface thereof; a plurality of source regions of the first conductivity type, selectively provided in the base regions at surfaces thereof; and a plurality of gate electrodes, each provided, via a gate electrode film, on a portion of the surface of one of the base regions, between one of the source regions and one of the first column regions. The first and second column regions of the first parallel pn structure are provided in the drift layer and reaching the buffer layer. The first and second column regions of the second parallel pn structure have depths that become shallower stepwise in said direction parallel to the surface of the semiconductor substrate toward an end portion of the semiconductor substrate. Bottoms of the second column regions of the second parallel pn structure are in the drift layer.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
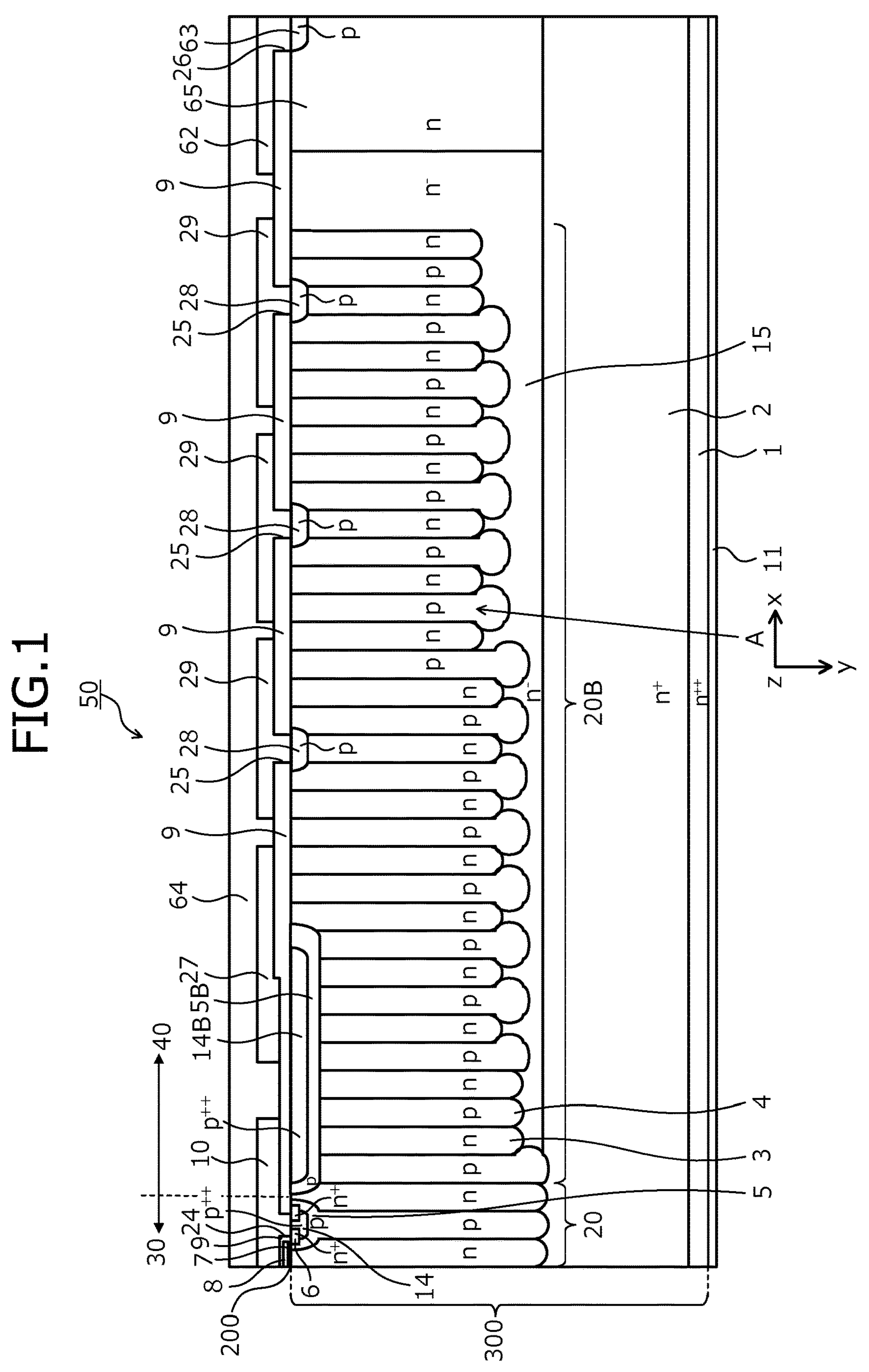
FIG. 1 is a cross-sectional view of a structure of a SJ-MOSFET according to an embodiment.

First, problems associated with the conventional techniques are discussed. As described, in the SJ-MOSFET, when the impurity concentration of the parallel pn region 120 is increased excessively to reduce the ON resistance, spreading of the depletion layer is hindered and the breakdown voltage decreases. To maximize characteristics of the active region 130, the breakdown voltage of the edge termination region 140 is set to be higher than that of the active region 130. Similarly to the active region 130, in the edge termination region 140 as well, electrons and holes of the n-type column regions 103 and the p-type column regions 104 adjacent to one another recombine according to the electric field distribution and the depletion layer spreads, however, no voltage is applied to the surface side of the edge termination region 140 and therefore, the electric field is distributed in a fan-like shape having a source electrode termination portion of the active region 130 as a center. As a result, the supply of the electrons and holes tends to become unbalanced and in the edge termination region 140, spreading in an outward direction and increasing the breakdown voltage are difficult.

Figure 21:
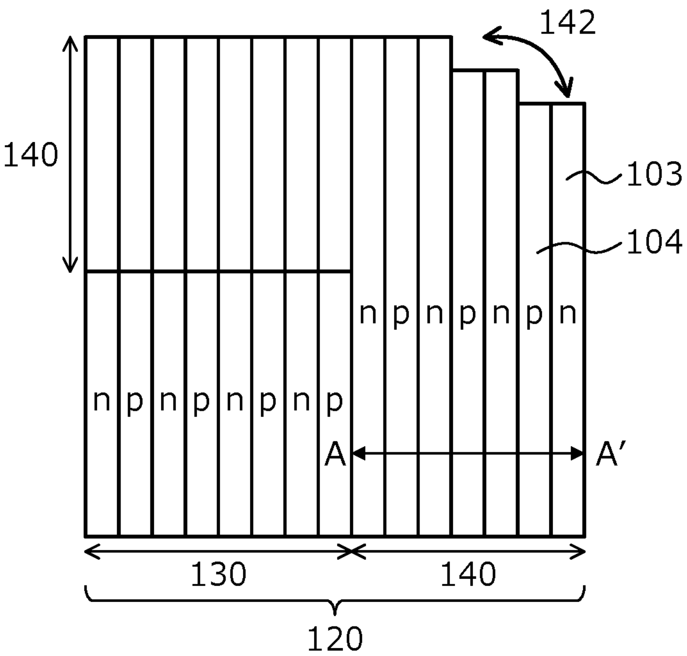
FIG. 21 is a schematic plan diagram depicting a structure of the SJ-MOSFET of the first conventional structure.
Figure 22:
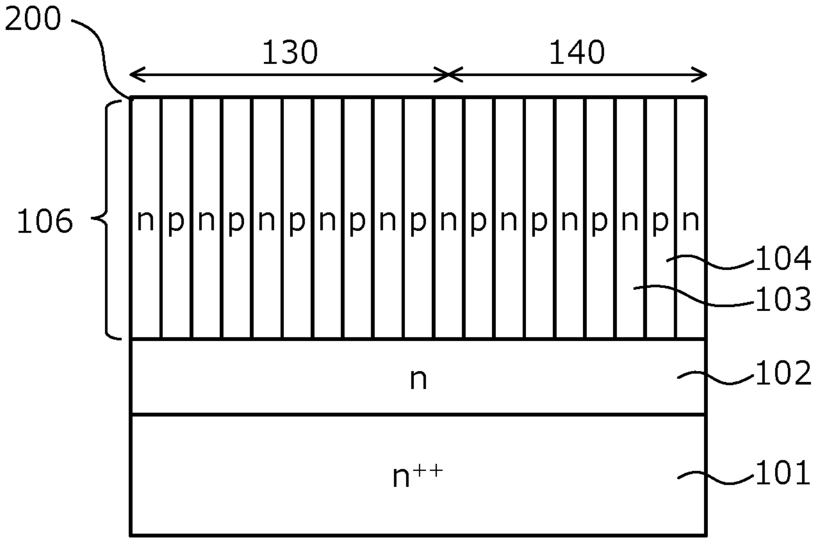
FIG. 22 is a schematic cross-sectional diagram of the structure of the SJ-MOSFET of the first conventional structure along cutting line A-A' in FIG. 21.

In the SJ-MOSFET of the first conventional structure, as depicted in FIGS. 21 and 22, the parallel pn region 120 has the same pitch in the active region 130 and in the edge termination region 140, that is, the width of the n-type column regions 103 and the width of the p-type column regions 104 are the same. In this instance, a problem arises in that in the edge termination region 140, depletion is difficult and the breakdown voltage of the edge termination region 140 easily decreases.

Figure 23:
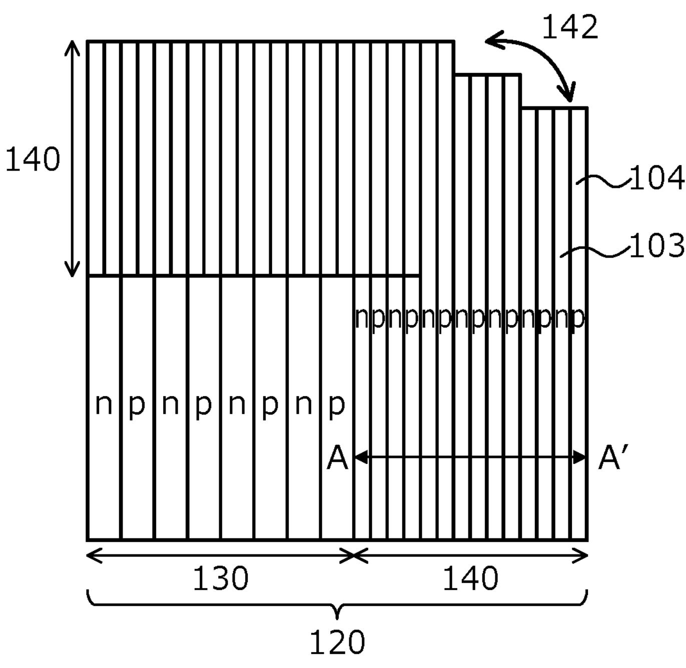
FIG. 23 is a schematic plan diagram depicting a structure of a SJ-MOSFET of a second conventional structure.
Figure 24:
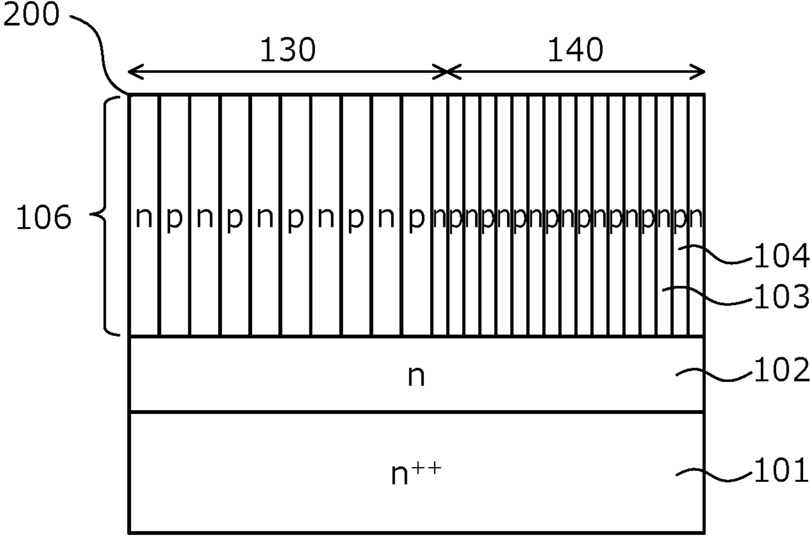
FIG. 24 is a schematic cross-sectional diagram depicting the structure of the SJ-MOSFET of the second conventional structure along cutting line A-A' in FIG. 23.

FIG. 23 is a schematic plan diagram depicting a structure of a SJ-MOSFET of a second conventional structure. FIG. 24 is a schematic cross-sectional diagram depicting the structure of the SJ-MOSFET of the second conventional structure along cutting line A-A' in FIG. 23. FIG. 23 depicts an arrangement of the n-type column regions 103 and the p-type column regions 104 of the second conventional structure in a plan view. FIG. 24 depicts a cross-section of the structure of the n-type column regions 103 and the p-type column regions 104 of the second conventional structure. In the SJ-MOSFET of the second conventional structure, as a method of setting the breakdown voltage of the edge termination region 140 to be higher than that of the active region 130, the pitch of the parallel pn region 120 in the edge termination region 140 is narrower than the pitch thereof in the active region 130, thereby facilitating spreading of the depletion layer. Further, as for a method of setting the breakdown voltage of the edge termination region 140 to be higher than that of the active region 130, there is a method of reducing the impurity concentration of the parallel pn region 120 in the edge termination region 140.

Nonetheless, in an instance in which the pitch of the parallel pn region 120 differs in the active region 130 and the edge termination region 140, a problem arises in that control of a pitch switching portion is difficult and decreases in the breakdown voltage tend to occur due to electric field unbalances caused by manufacturing process variation Embodiments of a superjunction semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

A semiconductor device according to the present invention is described taking a SJ-MOSFET as an example. FIG. 1 is a cross-sectional view of a structure of a SJ-MOSFET according to an embodiment. A SJ-MOSFET 50 depicted in FIG. 1 is a SJ-MOSFET that has metal oxide semiconductor (MOS) gates in a front side (side having p-type base regions 5) of a semiconductor wafer 300 (semiconductor chip) containing silicon (Si). In FIG. 1, a single unit cell (functional unit of a device element) is depicted while other unit cells adjacent hereto are not depicted.

An $n^{++}$-type semiconductor substrate (semiconductor substrate of a first conductivity type) 1, for example, is a silicon single crystal substrate doped with arsenic (As) or phosphorus (P). On the $n^{++}$-type semiconductor substrate 1, an $n^{+}$-type buffer layer 2 is provided. The $n^{+}$-type buffer layer 2 has an impurity concentration that is lower than an impurity concentration of the $n^{++}$-type semiconductor substrate 1 and, for example, is a high-concentration n-type layer doped with phosphorus. On the $n^{+}$-type buffer layer 2, an $n^-$-type drift layer 15 is provided. The $n^-$-type drift layer 15 has an impurity concentration that is lower than the impurity concentration of the $n^+$-type buffer layer 2 and, for example, is a low-concentration n-type layer doped with phosphorus. Hereinafter, the $n^{++}$-type semiconductor substrate 1, the $n^+$-type buffer layer 2, and the $n^-$-type drift layer 15 combined are regarded as the semiconductor wafer 300. An upper surface of the semiconductor wafer 300 is regarded as the surface 200. A MOS gate structure (device element structure) is formed in a front side (side having the surface 200) of the semiconductor wafer 300. Further, on a back surface of the semiconductor wafer 300, a back electrode 11 constituting a drain electrode is provided.

In an active region 30 of the SJ-MOSFET 50, a parallel pn region 20 is disposed in which n-type column regions 3 and a p-type column regions 4 are disposed alternating with one another repeatedly. In an edge termination region 40, a later-described parallel pn region 20B is provided in which the n-type column regions 3 and the p-type column regions 4 are disposed alternating with one another repeatedly.

In FIG. 1, a direction in which the n-type column regions 3 and the p-type column regions 4 of the parallel pn region 20 are disposed alternating with one another is an x direction. On the p-type column regions 4 of the active region 30, the p-type base regions 5 are selectively provided. Bottoms of the p-type base regions 5 of the active region 30 are in contact with upper surfaces of the p-type column regions 4. The p-type base regions 5 of the active region 30 are provided in the semiconductor wafer 300, at the surface 200. The p-type column regions 4 are provided so as to reach the $n^+$-type buffer layer 2 from the surface 200 of the semiconductor wafer 300. A width of upper surfaces of the p-type base regions 5 is wider than a width of the p-type column regions 4. Similar to the p-type column regions 4, the n-type column regions 3 are also provided so as to reach the $n^+$-type buffer layer 2 from the surface 200 of the semiconductor wafer 300. As described hereinafter, in a plan view, a pattern of the n-type column regions 3 and the p-type column regions 4 in the active region 30 and the edge termination region 40, for example, is a striped pattern. In an instance in which, in a plan view, the pattern of the p-type column regions 4 is a striped pattern, a pattern of the p-type base regions 5 in a plan view is also a striped pattern.

An impurity concentration of the n-type column regions 3 is lower than an impurity concentration of the $n^{++}$-type semiconductor substrate 1. An impurity concentration of the p-type column regions 4 and an impurity concentration of the p-type base regions 5 may be equal to each other. Further, the impurity concentration of the n-type column regions 3 and the impurity concentration of the p-type column regions 4 may be equal to each other.

In the active region 30, in the p-type base regions 5, at surfaces thereof, $n^+$-type source regions (first semiconductor regions of the first conductivity type) 6 are selectively provided. In the active region 30, in the p-type base regions 5, at surfaces thereof, $p^{++}$-type contact regions 14 that are in contact with the $n^+$-type source regions 6 are selectively provided.

The MOS gate structure is provided in the active region 30. In particular, at surfaces of portions of the p-type base regions 5, between the $n^+$-type source regions 6 and the n-type column regions 3, gate electrodes 8 are provided via a gate electrode film 7. The gate electrodes 8 may be provided on surfaces of the n-type column regions 3, via the gate electrode film 7.

An interlayer insulating film 9 is provided so as to cover the gate electrodes 8 at the surface 200 side of the semiconductor wafer 300. A source electrode 10, by contact holes 24 opened in the interlayer insulating film 9, is in contact with the $n^+$-type source regions 6 and the p-type base regions 5 and is electrically connected to the $n^+$-type source regions 6 and the p-type base regions 5. In an instance in which the $p^{++}$-type contact regions 14 are provided, the source electrode 10 is in contact with the $n^+$-type source regions 6 and the $p^{++}$-type contact regions 14 and is electrically connected to the $n^+$-type source regions 6 and the $p^{++}$-type contact regions 14.

The source electrode 10 is electrically insulated from the gate electrodes 8 by the gate electrode film 7 and the interlayer insulating film 9. On the source electrode 10, for example, a protective film 64 such as passivation film containing a polyimide is selectively provided.

Further, in the edge termination region 40, which maintains the breakdown voltage, gate wiring 27 is provided in a side of the edge termination region 40 closest to the active region 30, the gate wiring 27 being apart from the source electrode 10 and electrically connected to the gate electrodes 8. The gate wiring 27 is provided in substantially a ring-shape along a border between the active region 30 and the edge termination region 40.

In the edge termination region 40, in a region facing the source electrode 10 and the gate wiring 27 from below (y direction), a p-type base region 5B exposed at the front surface of the semiconductor wafer is provided so as to be in contact with upper portions of the n-type column regions 3 and upper portions of the p-type column regions 4. In the p-type base region 5B, the $p^{++}$-type contact region 14B exposed at the front surface of the semiconductor wafer may be provided. Therefore, potential of the p-type column regions 4 in contact with the p-type base region 5B is a source potential.

Multiple field plate electrodes 29 are disposed to be apart from the gate wiring 27 and further outward (closer to an end of the semiconductor wafer 300) than is the gate wiring 27. The field plate electrodes 29 are electrically connected to guard rings 28 by contact holes 25 opened in the interlayer insulating film 9. The field plate electrodes 29 and the guard rings 28 are provided in a ring-shape closer to the end of the semiconductor chip 300 than is the gate wiring 27. The guard rings 28 are regions that mitigate of electric field the edge termination region 40 and maintain the breakdown voltage.

A channel stopper electrode 62 is disposed to be apart from the field plate electrodes 29 and further outward (closer to the end of the semiconductor chip 300) than are the field plate electrodes 29. The channel stopper electrode 62 is electrically connected, by a contact hole 26 opened in the interlayer insulating film 9, to a p-type region 63 that functions as a channel stopper. An impurity concentration of the p-type region 63 may be equal to that of the guard rings 28. The channel stopper electrode 62 and the p-type region 63 is provided in a ring-shape closer to the end of the semiconductor chip 300 than are the field plate electrodes 29.

In the edge termination region 40 of the SJ-MOSFET 50, the parallel pn region 20B is provided. As depicted in FIG. 1, the $n^-$-type drift layer 15, which has an impurity concentration that is lower than the impurity concentration of the n-type column regions 3, is selectively provided between a bottom of the parallel pn region 20B and the $n^+$-type buffer layer 2. The p-type column regions 4, as described hereinafter, are formed in the $n^-$-type drift layer 15 by ion-implanting a p-type impurity. Further, the n-type column regions 3 are formed in the $n^-$-type drift layer 15 by ion-implanting an n-type impurity. A depth of the n-type column regions 3 and the p-type column regions 4 of the parallel pn region 20 from the surface 200, in an XY plane depicted in FIG. 1, decreases stepwise in the outward direction of the SJ-MOSFET 50 (positive direction of X-axis, direction to the p-type region 63). The impurity concentration of the $n^-$-type drift layer 15 is lower than the impurity concentration of the n-type column regions 3 and therefore, more of the ion-implanted p-type impurity diffuses than in the n-type column regions 3. Thus, at locations where the depth of the p-type column regions 4 is deeper than the depth of the n-type column regions 3, bottoms of the p-type column regions 4 in contact with the $n^-$-type drift layer 15 are wider than the portions of the p-type column regions 4 in contact with the n-type column regions 3 and have a bulging shape. Due to this shape, a distance between any two of the p-type column regions 4 facing each other across one of the n-type column regions 3 is shorter at the bottoms of the p-type column regions 4, and the bottoms of the p-type column regions 4 have regions that bulge in the outward direction of the SJ-MOSFET 50 and have a large amount of the p-type impurity. Thus, a resulting effect includes depletion proceeding with favorable balance between the bottoms of the p-type column regions 4 and the $n^+$-type buffer layer 2 and suppression of an occurrence of electric field concentration.

Further, in the embodiment, the impurity concentration of the $n^+$-type buffer layer 2 is higher than the impurity concentration of the n-type column regions 3. As a result, the ON resistance of the active region 30 may be reduced. Further, when high-energy particles such as cosmic rays penetrate into the SJ-MOSFET 50 with a certain probability, the electric field state in the SJ-MOSFET 50 changes and the depletion layer may reach close to the border between the $n^+$-type buffer layer 2 and the $n^{++}$-type semiconductor substrate 1. In this case, an effect is obtained in that an occurrence of avalanche due to electric field concentration that is due to extreme concentration differences between the $n^+$-type buffer layer 2 and the $n^{++}$-type semiconductor substrate 1 may be mitigated.

In the edge termination region 40, the $n^-$-type drift layer 15 is provided closer to the end of the semiconductor chip 300 than is the parallel pn region 20. The $n^-$-type drift layer 15 is continuous with (connected to) the $n^-$-type drift layer 15 provided at the bottom of the parallel pn region 20. An n-type region 65 is further provided closer to the end of the semiconductor chip 300 than is the $n^-$-type drift layer 15. An impurity concentration of the n-type region 65 may be equal to the impurity concentration of the n-type column regions 3. The channel stopper electrode 62 is provided on the upper surfaces of the $n^-$-type drift layer 15 and the n-type region 65, via the interlayer insulating film 9. The channel stopper electrode 62 is electrically connected to the p-type region 63 by the contact hole 26 opened in the interlayer insulating film 9.

Figure 2:
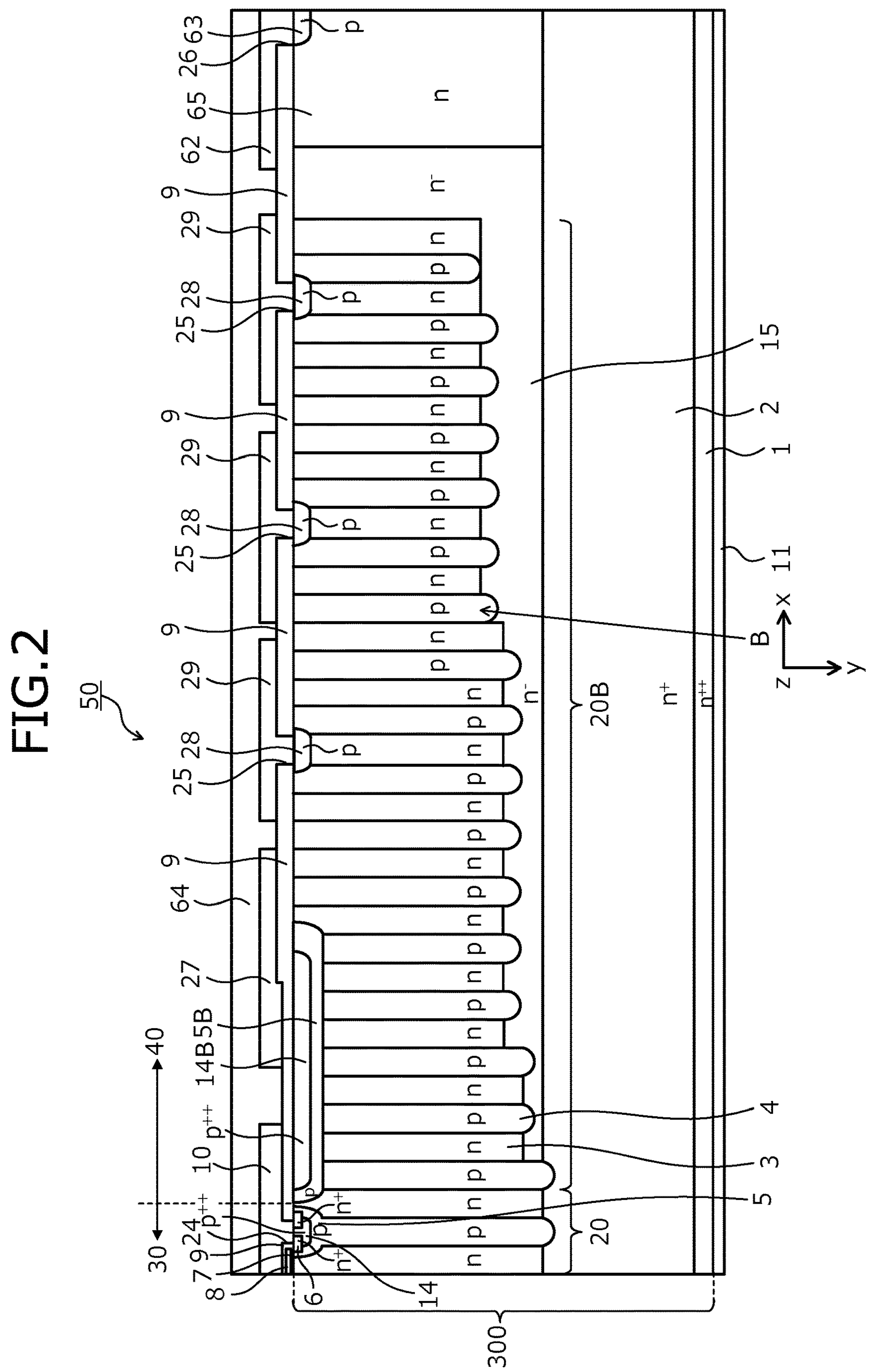
FIG. 2 is a cross-sectional view depicting another structure of the SJ-MOSFET according to the embodiment.

Here, FIG. 2 is a cross-sectional view depicting another structure of the SJ-MOSFET according to the embodiment. FIG. 2 depicts a shape in which the bottoms of the p-type column regions 4 in contact with the $n^-$-type drift layer 15 have a same width as that of portions of the p-type column regions 4 in contact with the n-type column regions 3. This shape is in an instance in which the p-type column regions 4 are formed by epitaxially growing the $n^+$-type buffer layer 2 and the $n^-$-type drift layer 15 and thereafter, forming trenches and embedding an epitaxially grown p-type region in the trenches. The n-type column regions 3 may be formed by performing, for example, ion implantation when the $n^-$-type drift layer 15 is epitaxially grown and forming the n-type column regions 3 to have an impurity concentration that is higher than the impurity concentration of the $n^-$-type drift layer 15. After the regions constituting the n-type column regions 3 are formed, the trenches are formed. In this instance, ion implantation for forming the p-type column regions 4 is not performed, the p-type impurity does not diffuse to thereby form the shape depicted in FIG. 2. By this shape as well, effects of the SJ-MOSFET according to the embodiment are obtained.

Further, as depicted in FIGS. 1 and 2, the bottoms of the p-type column regions 4 of the parallel pn region 20B, excluding among the p-type column regions 4, an innermost one closest to the active region 30 and an outermost one closest to the end of the semiconductor chip 300, may be in contact with the $n^+$-type buffer layer 2. Further, as depicted in FIG. 1, in the edge termination region 40, both sides of the bottom of the p-type column region 4 (indicated by arrow A) whose depth is shallower than that of an adjacent one of the p-type column regions 4, may be in contact with the $n^-$-type drift layer 15 or as depicted in FIG. 2, in the edge termination region 40, only one side of the bottom of the p-type column region 4 (indicated by arrow B) whose depth is shallower than that of an adjacent one of the p-type column regions 4, may be in contact with the $n^-$-type drift layer 15.

Figure 3:
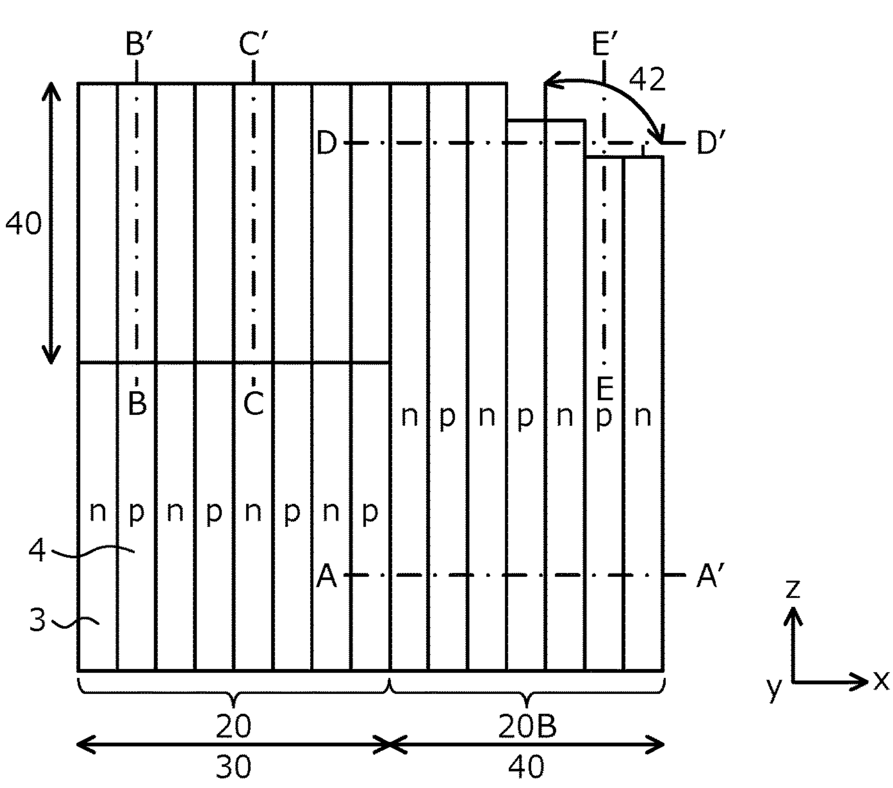
FIG. 3 is a schematic plan diagram depicting the structure of the SJ-MOSFET according to the embodiment.

Here, FIG. 3 is a schematic plan diagram depicting the structure of the SJ-MOSFET according to the embodiment. FIG. 3 depicts an arrangement of the n-type column regions 3 and the p-type column regions 4 in the parallel pn region 20 and in the parallel pn region 20B, in a plan view. As depicted in FIG. 3, the parallel pn region 20 is provided in the active region 30, which is a region in which a device element structure is formed and through which current flows during an ON state, and the parallel pn region 20B is provided in the edge termination region 40, which surrounds the active region 30. The edge termination region 40 is a region that mitigates electric field of the surface 200 side of the semiconductor wafer 300 and maintains the breakdown voltage. In the edge termination region 40, an edge termination R portion 42, which is corner portion that has been rounded, is provided to mitigate the electric field.

As depicted in FIG. 3, the pitch of the parallel pn region 20 and the pitch of the parallel pn region 20B are the same. In the parallel pn region 20 and the parallel pn region 20B, the widths of the n-type column regions 3 are the same and the widths of the p-type column regions 4 are the same. Further, in the parallel pn region 20 and the parallel pn region 20B, the impurity concentrations of the n-type column regions 3 may be the same, and in the parallel pn region 20 and the parallel pn region 20B, the impurity concentrations of the p-type column regions 4 may be the same.

Figure 4:
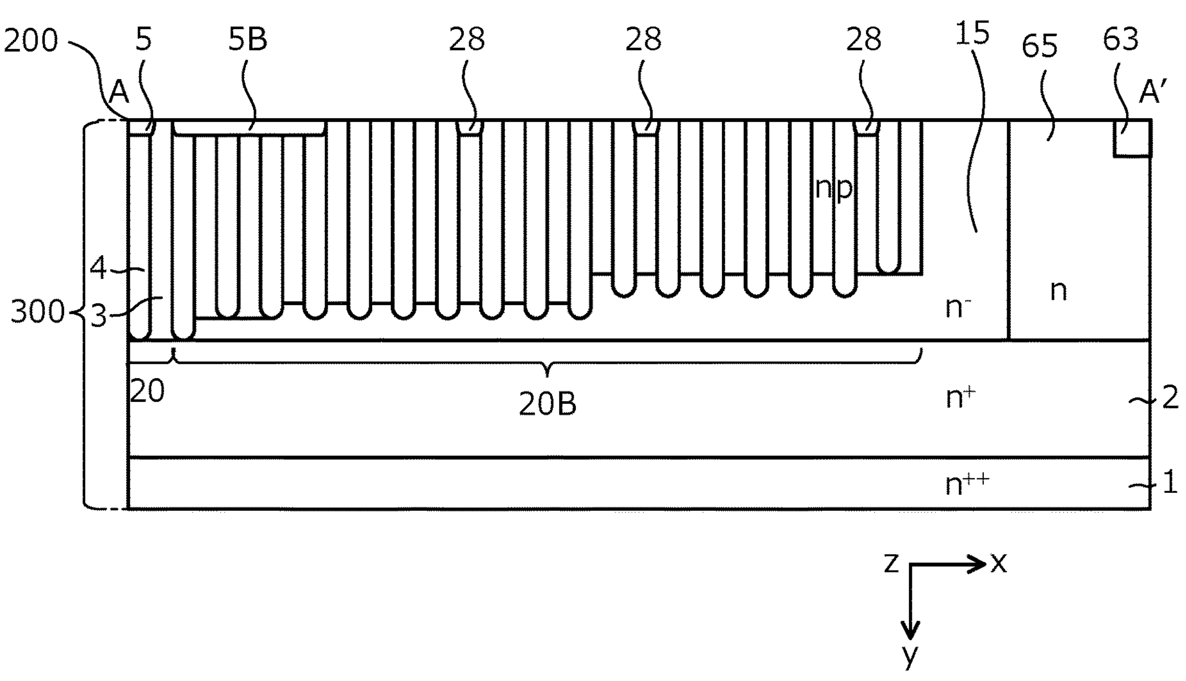
FIG. 4 is a schematic cross-sectional diagram depicting the structure of the SJ-MOSFET according to the embodiment along cutting line A-A' in FIG. 3.

Further, FIG. 4 is a schematic cross-sectional diagram depicting the structure of the SJ-MOSFET according to the embodiment along cutting line A-A' in FIG. 3. In FIG. 4, to describe the configuration of the parallel pn region 20B in detail, a greater number of the n-type column regions 3 and a greater number of the p-type column regions 4 are depicted than in FIG. 3; similarly in later-described FIG. 7. FIG. 4 depicts the parallel pn region 20B of the edge termination region 40 adjacent to the active region 30 in the x direction, more simply than FIG. 1 (structures, such as MOS gates provided in the surface 200 side of the semiconductor wafer 300 and the back electrode 11 provided on the back surface of the semiconductor wafer 300 are not depicted, while the parallel pn region 20 and the parallel pn region 20B are simplified).

Figure 5:
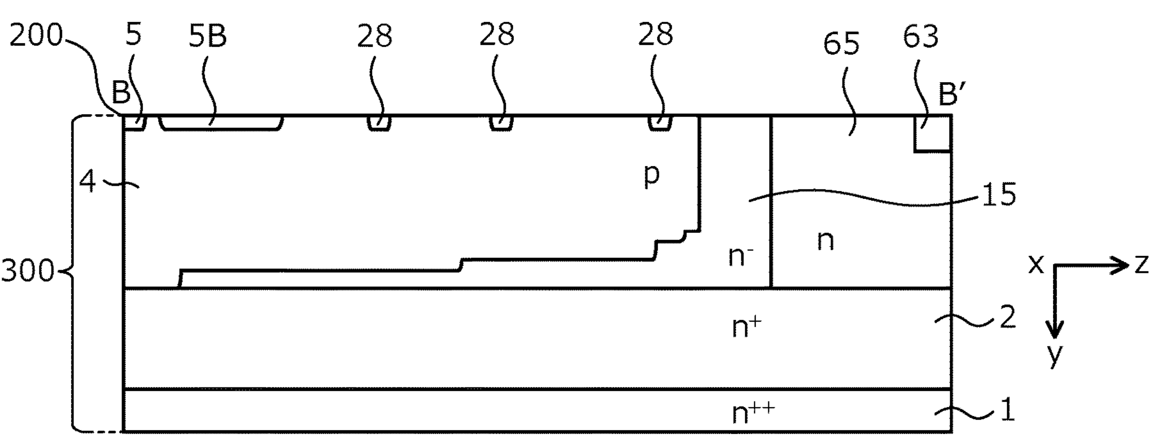
FIG. 5 is a schematic cross-sectional diagram depicting the structure of the SJ-MOSFET according to the embodiment along cutting line B-B' in FIG. 3.
Figure 6:
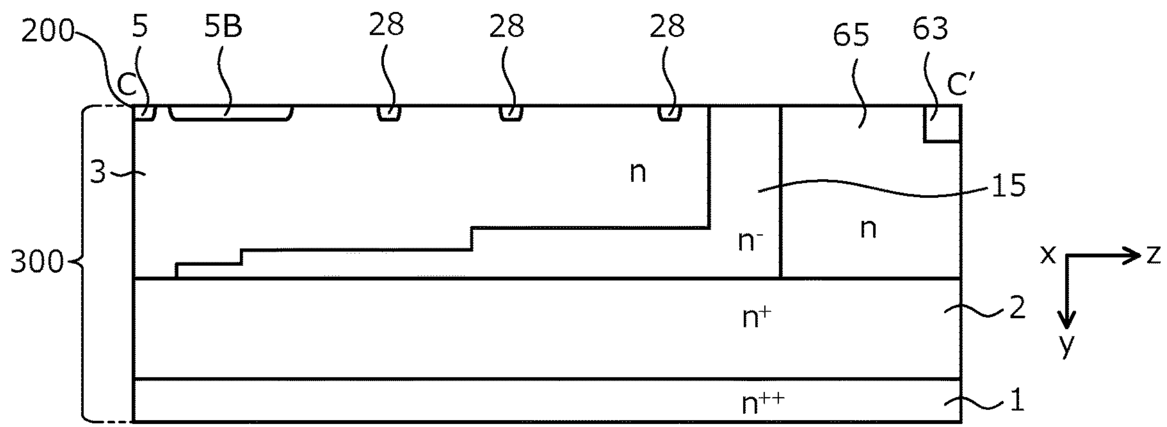
FIG. 6 is a schematic cross-sectional diagram depicting the structure of the SJ-MOSFET according to the embodiment along cutting line C-C' in FIG. 3.

FIG. 5 is a schematic cross-sectional diagram depicting the structure of the SJ-MOSFET according to the embodiment along cutting line B-B' in FIG. 3. FIG. 6 is a schematic cross-sectional diagram depicting the structure of the SJ-MOSFET according to the embodiment along cutting line C-C' in FIG. 3. FIGS. 5 and 6 depict the structure of the parallel pn region 20B of the edge termination region 40 adjacent to the active region 30 in a "z" direction.

As depicted in FIGS. 4 to 6, in the parallel pn region 20B, the depths of the n-type column regions 3 and the p-type column regions 4 become shallower stepwise in a direction to the end portion of the SJ-MOSFET 50 (region in which the p-type region 63 is provided in the positive direction of x-axis and the positive direction of z-axis). Furthermore, the depths of the p-type column regions 4 are deeper than the depths of the n-type column regions 3 and the p-type column regions 4 are provided that have bottoms in the $n^-$-type drift layer 15. In this instance, both or one of the side surfaces of the bottoms of the p-type column regions 4 are/is in contact with the $n^-$-type drift layer 15.

In this manner, in the embodiment, in the edge termination region 40, at the bottom of the parallel pn region 20B, a pn ratio is set to be extremely unbalanced and p-rich. The pn ratio is a ratio of a product of the size (width×depth) of the p-type column regions 4 and the impurity concentration of the p-type column regions 4 to a product of the size (width×depth) of the n-type column regions 3 and the impurity concentration of the n-type column regions 3; and p-rich means the product of the size of the p-type column regions 4 and the impurity concentration of the p-type column regions 4 is greater than the product of the size of the n-type column regions 3 and the impurity concentration of the n-type column regions 3. As a result, electrons of the back side are insufficient and electrons are sourced from the p-type column regions 4, whereby spreading of a depletion layer in a direction to a termination side (side where the p-type region 63 is provided) is facilitated while a depletion layer spreads in a direction to the $n^+$-type buffer layer 2 at the device element back side, thereby enabling depletion of the entire edge termination region 40 to be facilitated and maintenance of the breakdown voltage to be facilitated. Further, in this structure, electric field concentrates at the back side and therefore, an impact of electric field concentration due to charge at the surface side may be reduced. In this manner, in the embodiment, spreading of the depletion layer may be facilitated without changing the pitch of the parallel pn regions 20, 20B in the active region 30 or the edge termination region 40.

Figure 7:
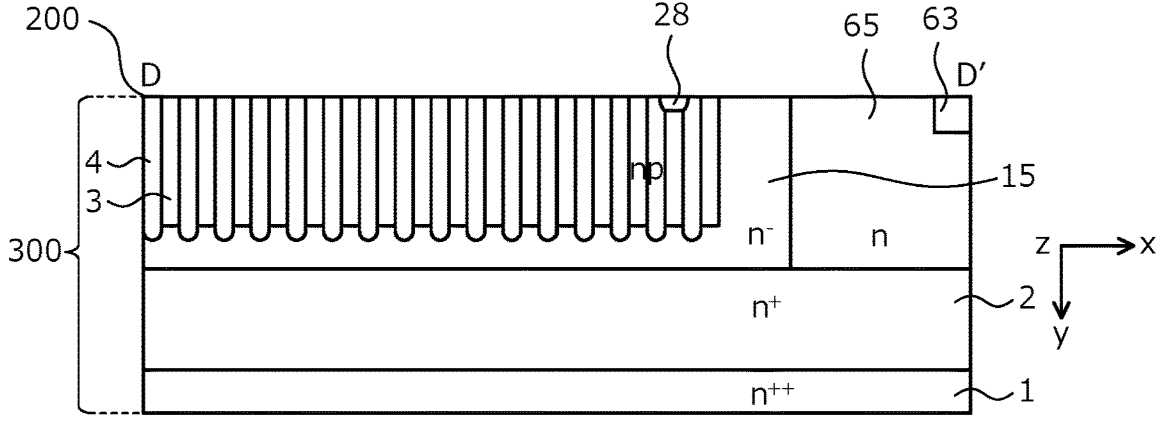
FIG. 7 is a schematic cross-sectional diagram depicting the structure of the SJ-MOSFET according to the embodiment along cutting line D-D' in FIG. 3.
Figure 8:
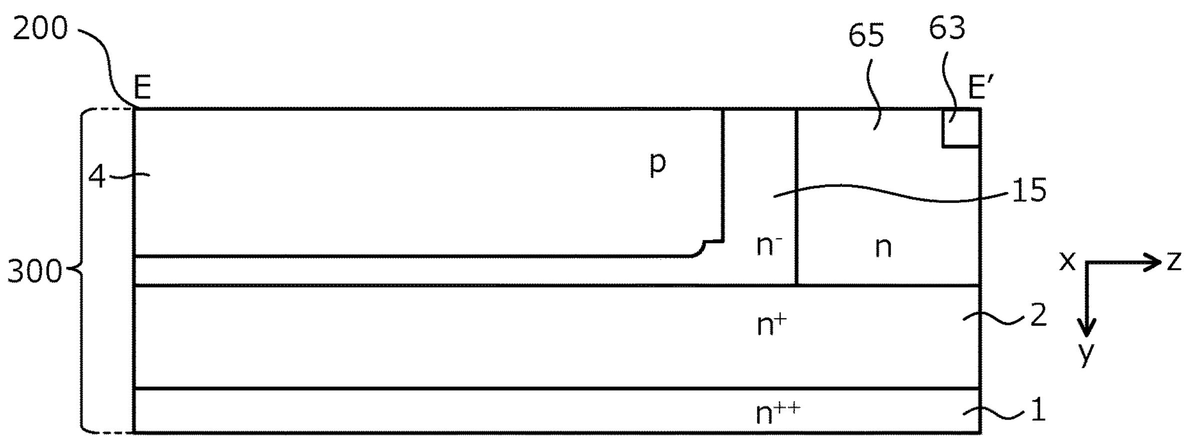
FIG. 8 is a schematic cross-sectional diagram depicting the structure of the SJ-MOSFET according to the embodiment along cutting line E-E' in FIG. 3.

Here, FIG. 7 is a schematic cross-sectional diagram depicting the structure of the SJ-MOSFET according to the embodiment along cutting line D-D' in FIG. 3. FIG. 8 is a schematic cross-sectional diagram depicting the structure of the SJ-MOSFET according to the embodiment along cutting line E-E' in FIG. 3. FIGS. 7 and 8 depict the structure of the parallel pn region 20B from the active region 30 to the edge termination R portion 42.

As depicted in FIGS. 7 and 8, in this portion, in the parallel pn region 20B, the depths of the n-type column regions 3 and the depths of the p-type column regions 4 are constant. This portion is between a region of the source potential and a region of a drain potential, is easily depleted when voltage is applied between the drain and source, does not need to be structured to facilitate spreading of a depletion layer and thus, the structure is the same as the conventional structure.

Further, in a specific example of the structure of the embodiment, with a breakdown voltage of 650V, the $n^+$-type buffer layer 2 has a film thickness of 40 μm and an impurity concentration of $2\times10^{16}/cm^3$, while in the active region 30, the n-type column regions 3 and the p-type column regions 4 have a depth of 20 μm and a peak impurity concentration of about $6\times10^{15}/cm^3$ and the width of the n-type column regions 3 and the p-type column regions 4 is about 4 μm. The $n^{++}$-type semiconductor substrate 1 has a thickness of 60 μm and an impurity concentration of $4\times10^{19}/cm^3$ while the $n^-$-type drift layer 15 has an impurity concentration of about $3\times10^{14}/cm^3$.

Figure 9:
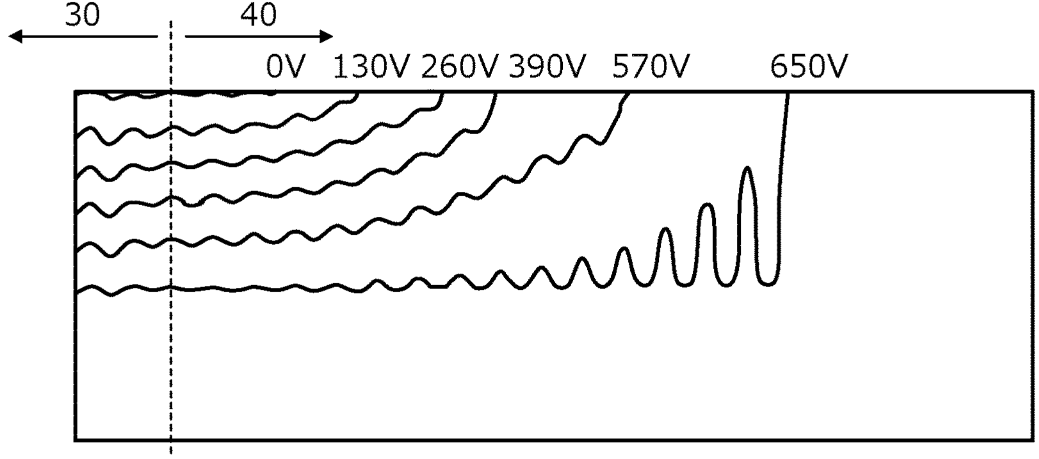
FIG. 9 is a graph depicting results of simulation of electric field distribution of a SJ-MOSFET of a first conventional structure.
Figure 10:
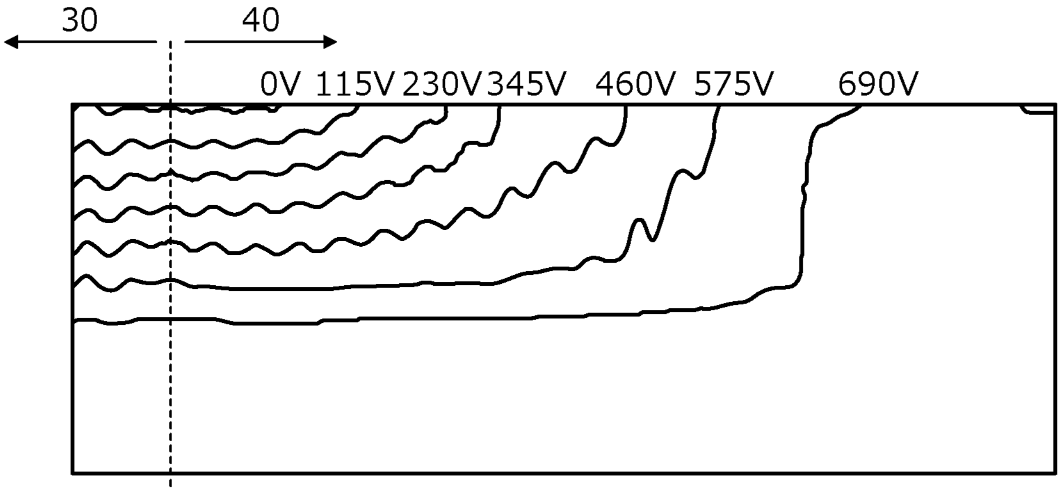
FIG. 10 is a graph depicting results of simulation of electric field distribution of the SJ-MOSFET according to the embodiment.

FIG. 9 is a graph depicting results of simulation of electric field distribution of the SJ-MOSFET of the first conventional structure (FIG. 22). FIG. 10 is a graph depicting results of simulation of electric field distribution of the SJ-MOSFET according to the embodiment (FIG. 1). The simulation results are for a state in which the p-type base regions 5, 5B, and the guard rings 28 are formed. In the SJ-MOSFET of the first conventional structure, spreading of the depletion layer is difficult in the termination side and the breakdown voltage decreases. On the other hand, in the embodiment, a depletion layer easily spreads in a direction to the termination side and thus, the depletion layer spreads in the termination side, whereby depletion of the entire edge termination region 40 is facilitated and decreases in the breakdown voltage may be prevented.

Figure 11:
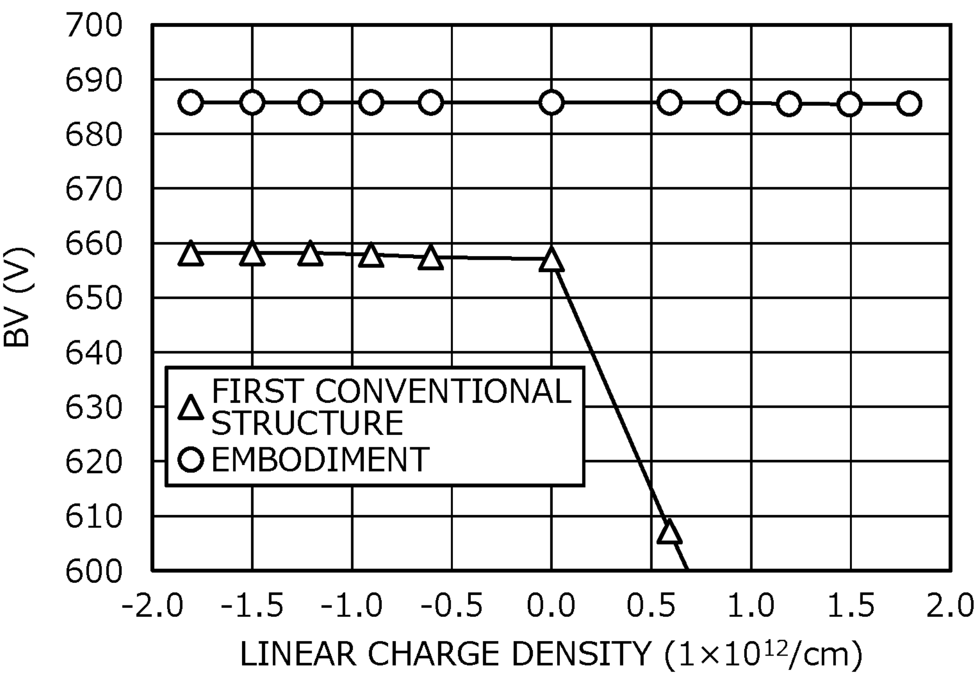
FIG. 11 is a graph depicting charge withstand capability of an edge termination region of the SJ-MOSFET of the first conventional structure and an edge termination region of the SJ-MOSFET according to the embodiment.

FIG. 11 is a graph depicting charge withstand capability of the edge termination region of the SJ-MOSFET of the first conventional structure and the edge termination region of the SJ-MOSFET according to the embodiment. In FIG. 11, a vertical axis indicates breakdown voltage (BV) in units of V. A horizontal axis indicates linear charge density of the surface of the edge termination region 40 in units of $1\times10^{12}$/cm. As depicted in FIG. 11, in the SJ-MOSFET according to the embodiment, the breakdown voltage of the edge termination region 40 is higher than the breakdown voltage of the edge termination region 140 of the first conventional structure. Furthermore, in the SJ-MOSFET of the first conventional structure, when there is a large amount of positive charge at the surface of the edge termination region 140, the breakdown voltage decreases, however, in the SJ-MOSFET according to the embodiment, even when there is a large amount of positive charge at the surface of the edge termination region 40, the breakdown voltage does not decrease. In this manner, the SJ-MOSFET according to the embodiment may reduce the impact of, for example, electric field concentration due to charge at the surface side.

Figure 12:
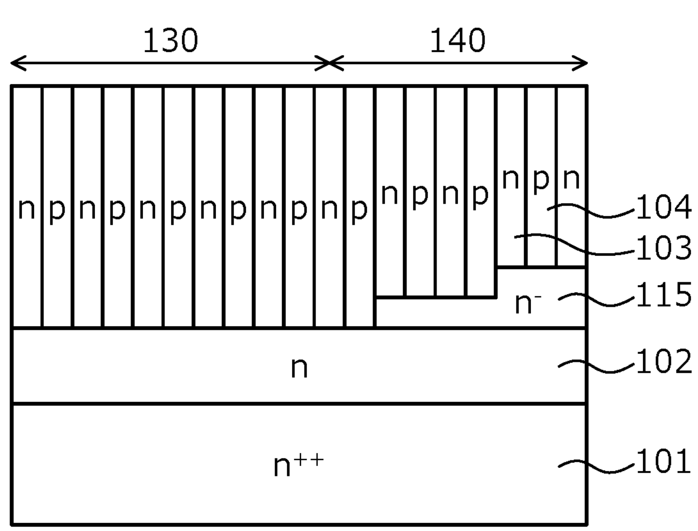
FIG. 12 is a schematic cross-sectional diagram depicting a structure of a SJ-MOSFET of a third conventional structure along cutting line A-A' in FIG. 21.
Figure 13:
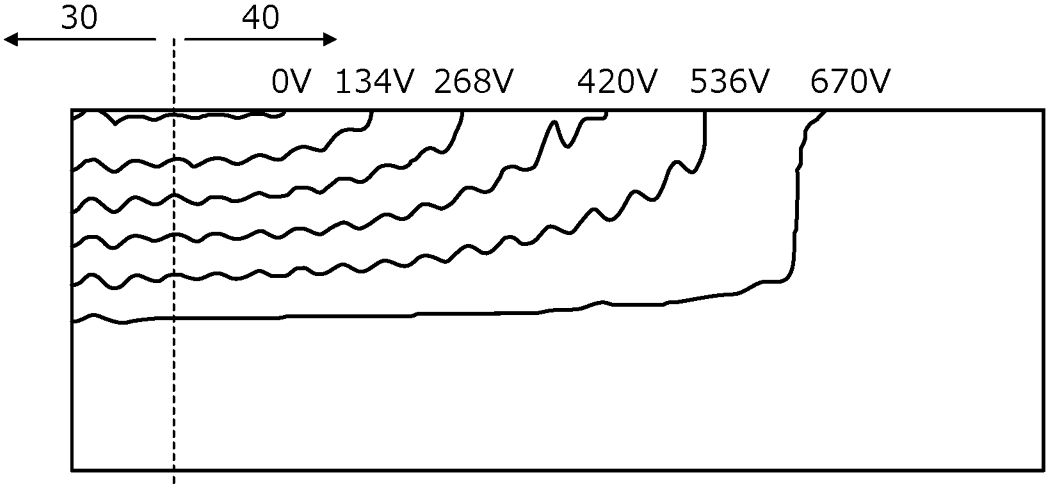
FIG. 13 is a graph depicting results of simulation of the electric field distribution of the SJ-MOSFET of the third conventional structure.

FIG. 12 is a schematic cross-sectional diagram depicting a structure of a SJ-MOSFET of a third conventional structure along cutting line A-A' in FIG. 21. FIG. 13 is a graph depicting results of simulation of the electric field distribution of the SJ-MOSFET of the third conventional structure. The SJ-MOSFET of the third conventional structure is the SJ-MOSFET of Japanese Laid-Open Patent Publication No. 2007-335844. A schematic plan diagram of the SJ-MOSFET of the third conventional structure is the same as the schematic plan diagram of the SJ-MOSFET of the first conventional structure and therefore, is not depicted in a separate drawing (refer to FIG. 21). As depicted in FIG. 12, in the SJ-MOSFET of the third conventional structure, the p-type column regions 104 and the n-type column regions 103 become shallower stepwise in the direction to the end portion, an $n^-$-type drift layer 115 is provided between the parallel pn region 120 and the n-type drift layer 102, however, one or both sides of the p-type column regions 104 is/are surrounded by the n-type column regions 103. Therefore, the p-type column regions 104 are supplied with electrons from an adjacent n-type column region 103 and depleted and thus, as depicted in FIG. 13, spreading of the depletion layer in a depth direction is difficult. In contrast, in the structure of the embodiment (refer to FIG. 4), the p-type column regions 4, which protrude beyond the n-type column regions 3, are supplied with electrons from the $n^-$-type drift layer 15 and depleted and thus, as depicted in FIG. 10, spreading of the depletion layer in the depth direction is facilitated and breakdown voltage that is higher than that of the structure of the third conventional structure may be maintained.

Figure 18:
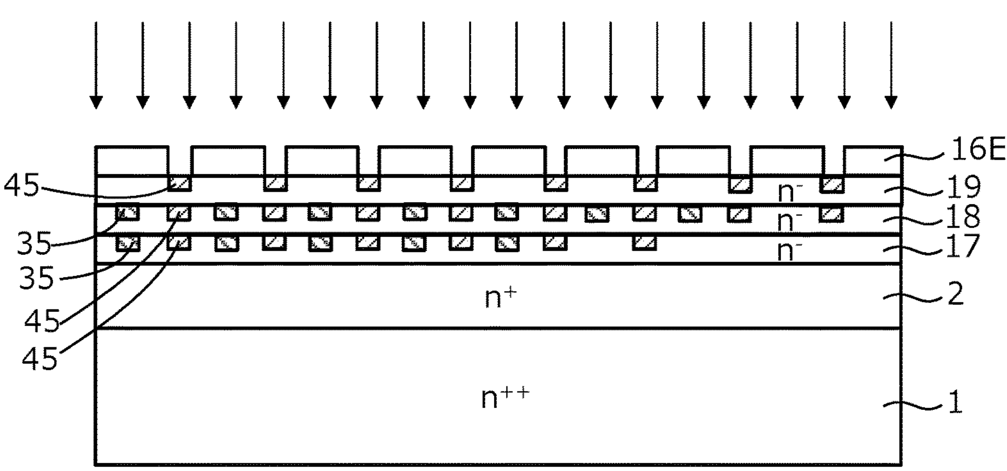
FIG. 18 is a cross-sectional view depicting a state of the parallel pn region of the edge termination region of the SJ-MOSFET according to the embodiment, during manufacture.
Figure 19:
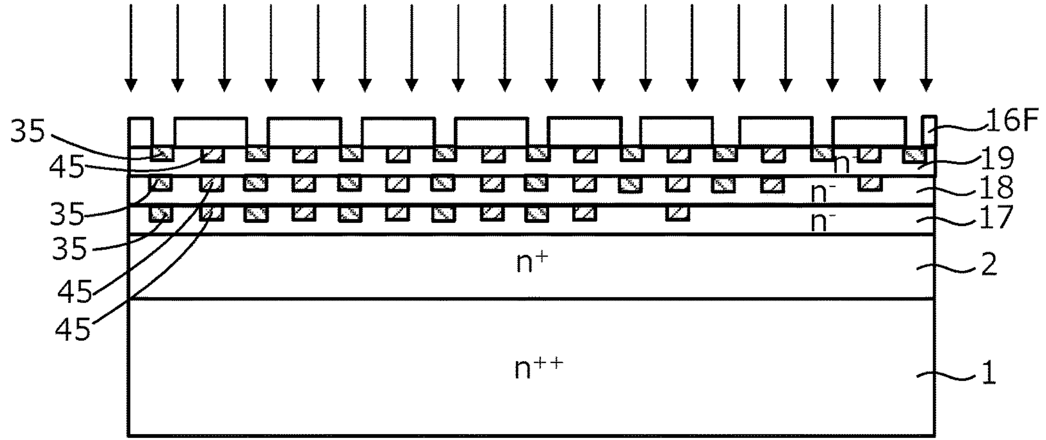
FIG. 19 is a cross-sectional view depicting a state of the parallel pn region of the edge termination region of the SJ-MOSFET according to the embodiment, during manufacture.
Figure 20:
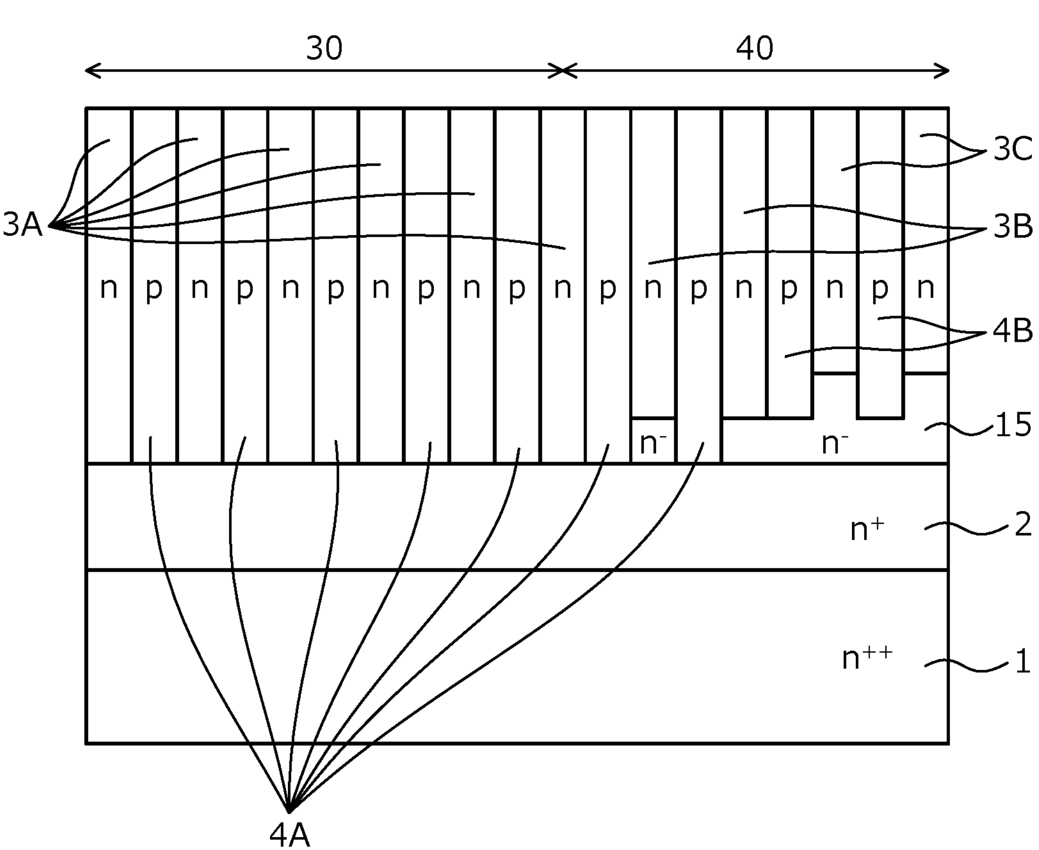
FIG. 20 is a cross-sectional view depicting a configuration of the parallel pn region formed by the processes depicted in FIGS. 14 to 19.

An example of a method of forming a portion of the parallel pn region 20B of the edge termination region 40 of the semiconductor device according to the embodiment is depicted. FIGS. 14, 15, 16, 17, 18, and 19 are cross-sectional views depicting states of the parallel pn region of the edge termination region of the SJ-MOSFET according to the embodiment, during manufacture. FIG. 20 is a cross-sectional view depicting a configuration of the parallel pn region formed by the processes depicted in FIGS. 14 to 19.

Figure 14:
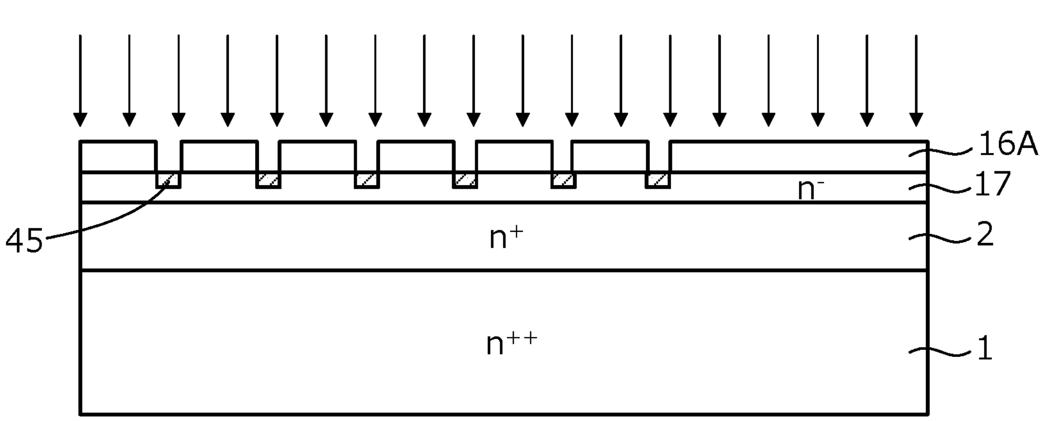
FIG. 14 is a cross-sectional view depicting a state of a parallel pn region of the edge termination region of the SJ-MOSFET according to the embodiment, during manufacture.

First, the $n^+$-type buffer layer 2 is formed on the $n^{++}$-type semiconductor substrate 1. A semiconductor wafer in which the $n^+$-type buffer layer 2 is formed on the $n^{++}$-type semiconductor substrate 1 may be used. Next, on the surface of the $n^+$-type buffer layer 2, an $n^-$-type epitaxial layer 17 is epitaxially grown. Next, on the surface of the $n^-$-type epitaxial layer 17, an ion implantation mask 16A having predetermined openings is formed by a photolithographic technique, using, for example, a resist film. The openings are provided in regions where the p-type column regions 4A of a deep depth are formed (refer to FIG. 20). Next, a p-type impurity is implanted. As a result, p-type ion-implanted regions 45 implanted with the p-type impurity and constituting respective portions of the p-type column regions 4A at a deep depth are formed. The state up to here is depicted in FIG. 14.

Figure 15:
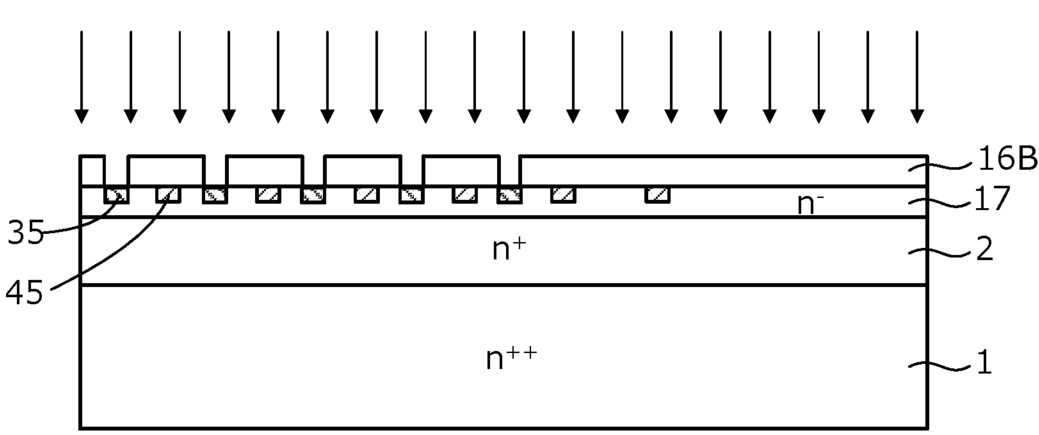
FIG. 15 is a cross-sectional view depicting a state of the parallel pn region of the edge termination region of the SJ-MOSFET according to the embodiment, during manufacture.

Next, the ion implantation mask 16A is removed and an ion implantation mask 16B having predetermined openings is formed on the surface of the $n^-$-type epitaxial layer 17 by a photolithographic technique, using, for example, a resist film. The openings are provided in regions where the n-type column regions 3A of a deep depth are formed (refer to FIG. 20). Next, an n-type impurity is implanted. As a result, n-type ion-implanted regions 35 implanted with the n-type impurity and constituting respective portions of the n-type column regions 3A at a deep depth are formed. The state up to here is depicted in FIG. 15.

Figure 16:
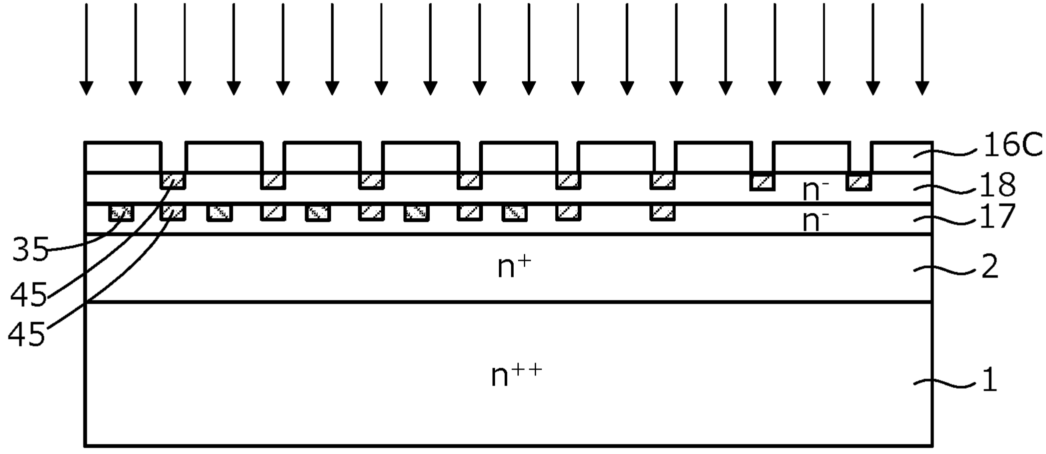
FIG. 16 is a cross-sectional view depicting a state of the parallel pn region of the edge termination region of the SJ-MOSFET according to the embodiment, during manufacture.

Next, the ion implantation mask 16B is removed and on the surface of the $n^-$-type epitaxial layer 17, an $n^-$-type epitaxial layer 18 is epitaxially grown. Next, on the surface of the $n^-$-type epitaxial layer 18, an ion implantation mask 16C having predetermined openings is formed by a photolithographic technique, using, for example, a resist film. The openings are provided in regions where the p-type column regions 4A of the deep depth and the p-type column regions 4B of a shallower depth are formed (refer to FIG. 20). Next, a p-type impurity is implanted. As a result, the p-type ion-implanted regions 45 implanted with the p-type impurity and constituting respective portions of the p-type column regions 4A of the deep depth and the p-type column regions 4B of the shallower depth are formed. The state up to here is depicted in FIG. 16.

Figure 17:
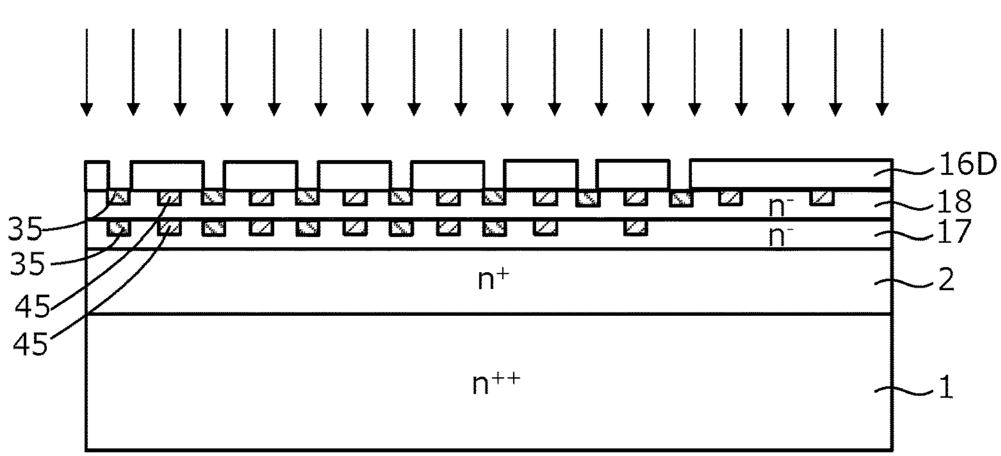
FIG. 17 is a cross-sectional view depicting a state of the parallel pn region of the edge termination region of the SJ-MOSFET according to the embodiment, during manufacture.

Next, the ion implantation mask 16C is removed and on the surface of the $n^-$-type epitaxial layer 18, an ion implantation mask 16D having predetermined openings is formed by a photolithographic technique, using, for example, a resist film. The openings are provided in regions where the n-type column regions 3A of the deep depth and the n-type column regions 3B of a next deep depth that is shallower than the deep depth of the n-type column regions 3A are formed (refer to FIG. 20). Next, an n-type impurity is implanted. As a result, the n-type ion-implanted regions 35 implanted with the n-type impurity and constituting respective portions of the n-type column regions 3A of the deep depth and the n-type column regions 3B of the next deep depth are formed. The state up to here is depicted in FIG. 17.

Next, the ion implantation mask 16D is removed and on the surface of the $n^-$-type epitaxial layer 18, an $n^-$-type epitaxial layer 19 is epitaxially grown. Next, on the surface of the $n^-$-type epitaxial layer 19, an ion implantation mask 16E having predetermined openings is formed by a photolithographic technique, using, for example, a resist film. The openings are provided in regions in which the p-type column regions 4A of the deep depth and the p-type column regions 4B of a shallow depth are formed. Next, a p-type impurity is implanted. As a result, the p-type ion-implanted regions 45 implanted with the p-type impurity and constituting respective portions of the p-type column regions 4A of the deep depth and the p-type column regions 4B of the shallow depth are formed. The state up to here is depicted in FIG. 18.

Next, the ion implantation mask 16E is removed and on the surface of the $n^-$-type epitaxial layer 19, an ion implantation mask 16F having predetermined openings is formed by a photolithographic technique, using, for example, a resist film. The openings are provided in regions where the n-type column regions 3A of the deep depth, the n-type column regions 3B of the next deep depth, and the n-type column regions 3C of the shallow depth are formed (refer to FIG. 20). Next, an n-type impurity is implanted. As a result, the n-type ion-implanted regions 35 implanted with the n-type impurity and constituting respective portions of the n-type column regions 3A to 3C are formed. The $n^-$-type epitaxial layer 17, 18 implanted with an impurity constitute the $n^-$-type drift layer 15. The state up to here is depicted in FIG. 19.

Subsequently, the epitaxial growth depicted in FIGS. 18 and 19, the ion implantation of a p-type impurity, and the ion implantation of an n-type impurity are repeated a predetermined number of times thereby, forming the n-type ion-implanted regions 35 and p-type ion-implanted regions and a heat treatment is performed, thus, depths become shallower stepwise in a termination direction depicted in FIG. 20 and furthermore, the depths of the p-type column regions 4 are deeper than the depths of the n-type column regions 3 and the parallel pn region 20B is formed in which the p-type column regions 4 are provided that have bottoms in the $n^-$-type drift layer 15. In FIGS. 14 to 19, widths of openings in ion implantation masks 16 are the same as widths of the openings when the parallel pn region 20 is formed in the active region 30. Therefore, formation is possible without changing pitches of the pn columns and decreases in the breakdown voltage due to unbalanced electric fields resulting from manufacturing process variation may be prevented.

Further, the p-type column regions 4 of the parallel pn region 20B of the edge termination region 40 of the SJ-MOSFET according to the embodiment may be formed as follows. First, the $n^+$-type buffer layer 2 and the $n^-$-type drift layer 15 are epitaxially grown. When the $n^-$-type drift layer 15 is epitaxially grown, an n-type impurity is ion-implanted, thereby forming the n-type column regions 3. Next, on the surfaces (upper most surface of the epitaxially grown $n^-$-type drift layer 15) of the n-type column regions 3, an oxide film is formed. Next, on the surface of the oxide film, a resist mask is formed by photolithography to have openings at positions where the p-type column regions 4 are formed.

Next, the resist mask is used as a mask and by dry etching, openings that expose the n-type column regions 3 are formed in the oxide film. Next, the resist mask is removed, the oxide film having the openings is used as a mask and, for example, anisotropic dry etching is performed, thereby forming p-type column trenches in the n-type column regions 3. Next, the oxide film is removed. Next, a p-type epitaxial layer is epitaxially grown so as to cover the surfaces of the n-type column regions 3 and to be embedded in the p-type column trenches, thereby forming the p-type column regions 4.

In this instance as well, the width of the openings of the resist mask when the trenches are formed is the same as the width of the openings when the parallel pn region 20 is formed in the active region 30. Therefore, formation is possible without changing the pitch of the pn columns and decreases in the breakdown voltage due to unbalanced electric fields resulting from manufacturing process variation may be prevented.

In the foregoing, as described above, according to the embodiment, in the parallel pn region, the depths of the n-type column regions and the p-type column regions become shallower stepwise in the direction to the end portion and furthermore, the depths of the p-type column regions are deeper than the depths of the n-type column regions and the p-type column regions are provided that have bottoms in the $n^-$-type drift layer. As a result, electrons of the back side are insufficient and electrons are sourced from the p-type column regions and thus, spreading of a depletion layer in the direction to the termination side is facilitated while a depletion layer spreads in the direction of the $n^+$-type buffer layer of the device element back side, whereby depletion of the entire edge termination region may be facilitated and maintenance of the breakdown voltage may be facilitated. In this manner, spreading of the depletion layer may be facilitated without changing the pitch of parallel pn region in the active region or the edge termination region.

In the foregoing, as described, in the present invention, while an instance in which a MOS gate structure is configured on a first surface of a silicon substrate is described as an example, without limitation hereto, various modifications are possible such as the type of semiconductor (for example, silicon carbide (SiC), etc.), surface orientation of the substrate main surface, etc. Further, in the embodiment of the present invention, while a planar-type MOSFET is described as an example, without limitation hereto, application is possible to semiconductor devices of various configurations such as a superjunction semiconductor device or the like of a trench-type MOSFET, etc. Further, in the present invention, while the first conductivity type is assumed to be an n-type and the second conductivity type is assumed to be a p-type in the embodiments, the invention is similarly implemented when the first conductivity type is a p-type and the second conductivity type is an n-type.

As described above, the superjunction semiconductor device according to the present invention is useful for high-voltage semiconductor devices used in power converting equipment, in power source devices such as various types of industrial machines, etc.

According to the invention described above, in the parallel pn region, the depths of the n-type column regions and the p-type column regions decrease stepwise in the direction to the end portion and furthermore, the depths of the p-type column regions are deeper than the depths of the n-type column regions and the p-type column regions are provided that have bottoms in the $n^-$-type drift layer. As a result, electrons of the back side are insufficient and electrons are sourced from the p-type column regions and thus, spreading of a depletion layer in the direction to the termination side is facilitated while a depletion layer spreads in the direction of the $n^+$-type buffer layer of the device element back side, whereby depletion of the entire edge termination region may be facilitated and maintenance of the breakdown voltage may be facilitated. In this manner, spreading of the depletion layer may be facilitated without changing the pitch of parallel pn region in the active region or the edge termination region.

The superjunction semiconductor device according to the present invention achieves an effect in that spreading of a depletion layer of the edge termination region is facilitated without changing the pitch of parallel pn region in the active region or in the edge termination region.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A superjunction semiconductor device having an active region and a termination structure portion disposed on an outer side of the active region so as to surround a periphery of the active region in a plan view of the superjunction semiconductor device, the superjunction semiconductor device comprising:

a semiconductor substrate of a first conductivity type;

a buffer layer of the first conductivity type, provided on a surface of the semiconductor substrate and having an impurity concentration that is lower than an impurity concentration of the semiconductor substrate;

a drift layer of the first conductivity type, provided on an upper surface of the buffer layer and having an impurity concentration that is lower than the impurity concentration of the buffer layer;

a plurality of first column regions of the first conductivity type and a plurality of second column regions of a second conductivity type, repeatedly alternating one another in a first direction parallel to the surface of the semiconductor substrate, to thereby form a first parallel pn structure in the active region, and form a second parallel pn structure in the termination structure portion;

a plurality of base regions of the second conductivity type, provided in the first parallel pn structure at a surface thereof;

a plurality of source regions of the first conductivity type, selectively provided in the base regions at surfaces thereof; and a plurality of gate electrodes, each provided, via a gate electrode film, on a portion of the surface of one of the base regions, between one of the plurality of source regions and one of the plurality of first column regions, wherein the plurality of first column regions and the plurality of second column regions of the first parallel pn structure are provided in the drift layer and reaching the buffer layer, the plurality of first column regions and the plurality of second column regions of the second parallel pn structure have depths that become shallower stepwise in said first direction parallel to the surface of the semiconductor substrate toward an end portion of the semiconductor substrate, bottoms of the plurality of second column regions of the second parallel pn structure are in the drift layer, and at least one of the plurality of second column regions of the second parallel pn structure protrudes, in a second direction towards, and perpendicular to, the upper surface of the buffer layer, beyond two of the plurality of first column regions of the second parallel pn structure that are immediately adjacent to, and in the first direction sandwich, said at least one of the plurality of second column regions, said at least one of the plurality of second column regions having a bulged end.

2. The superjunction semiconductor device according to claim 1, wherein the plurality of first column regions of the first parallel pn structure and the plurality of first column regions of the second parallel pn structure have a same first width, and the plurality of second column regions of the first parallel pn structure and the plurality of second column regions of the second parallel pn structure have a same second width.

3. The superjunction semiconductor device according to claim 1, wherein each of the plurality of second column regions has two portions, including a first portion in contact with the drift layer, and a second portion in contact with at least one of the plurality of first column regions, the first portion being wider than the second portion.

4. The superjunction semiconductor device according to claim 1, wherein in the second parallel pn structure, the bottom of each of the plurality of second column regions, except for an innermost one thereof closest to the active region and an outermost one thereof closest to the end portion of the semiconductor substrate, is in the drift layer.

5. The superjunction semiconductor device according to claim 1, wherein in the second parallel pn structure, at least one of the plurality of second column regions has a bottom that is shallower than that of an adjacent one of the plurality of second column regions, and is in contact with the drift layer only at one side thereof in said first direction parallel to the surface of the semiconductor substrate.

6. The superjunction semiconductor device according to claim 1, wherein each of the first parallel pn structure and the second parallel pn structure has a striped pattern in the plan view.

7. The superjunction semiconductor device according to claim 1, wherein the impurity concentration of the buffer layer is higher than an impurity concentration of each of the plurality of first column regions.

8. The superjunction semiconductor device according to claim 3, wherein the first portion bulges toward the active region and the end portion of the semiconductor substrate.

* * * * *